United States Patent [19]
Deleonibus

[11] Patent Number: 6,150,241
[45] Date of Patent: Nov. 21, 2000

[54] METHOD FOR PRODUCING A TRANSISTOR WITH SELF-ALIGNED CONTACTS AND FIELD INSULATION

[75] Inventor: Simon Deleonibus, Claix, France

[73] Assignee: Commissariat a l'Energie Atomique, Paris, France

[21] Appl. No.: 09/147,438

[22] PCT Filed: Jun. 26, 1997

[86] PCT No.: PCT/FR97/01146

§ 371 Date: Dec. 23, 1998

§ 102(e) Date: Dec. 23, 1998

[87] PCT Pub. No.: WO97/50118

PCT Pub. Date: Dec. 31, 1997

[30] Foreign Application Priority Data

Jun. 27, 1996 [FR] France .................................. 96 08007

[51] Int. Cl.[7] ........................... H01L 21/20; H01L 21/30; H01L 21/301; H01L 21/34

[52] U.S. Cl. ........................... 438/479; 438/142; 438/149; 438/151; 438/197; 438/265; 438/299; 438/301; 438/303; 438/479; 438/517; 438/595; 438/597; 438/635; 438/637; 438/639; 257/330; 257/332; 257/347; 257/377; 257/382; 257/383; 257/384; 257/389; 257/395; 257/408; 257/412

[58] Field of Search ..................................... 438/597, 142, 438/149, 151, 197, 265, 242, 596, 270, 479, 517, 519, 521, 523; 257/406, 408, 412, 330, 332, 347, 389, 374, 395, 377, 396, 382, 383, 397, 384

[56] References Cited

U.S. PATENT DOCUMENTS

| | | | |
|---|---|---|---|
| 4,902,641 | 2/1990 | Koury, Jr. ................................ | 438/151 |
| 5,040,037 | 8/1991 | Yamaguchi et al. .................... | 357/23.7 |
| 5,315,144 | 5/1994 | Cherne ..................................... | 257/351 |
| 5,410,172 | 4/1995 | Koizumi et al. ......................... | 257/347 |
| 5,482,871 | 1/1996 | Pollack . | |
| 5,494,837 | 2/1996 | Subramanian et al. .................. | 438/149 |
| 5,567,966 | 10/1996 | Hwang ..................................... | 257/347 |
| 5,801,075 | 9/1998 | Gardner et al. .......................... | 438/197 |
| 5,874,341 | 2/1999 | Gardner et al. .......................... | 438/301 |
| 5,945,712 | 8/1999 | Kim ......................................... | 257/347 |
| 5,960,270 | 9/1999 | Misra et al. ............................. | 438/197 |
| 6,010,921 | 1/2000 | Soutome ................................. | 438/151 |

FOREIGN PATENT DOCUMENTS

| | | | |
|---|---|---|---|
| 6-085259 | 6/1994 | Japan . | |
| 7-014916 | 5/1995 | Japan . | |
| 410214969 | 8/1998 | Japan ............................ | H01L 29/78 |

OTHER PUBLICATIONS

High Pressure Oxidation of Silicon in Dry Oxygen, by Liang N. Lie et al, in Solid–State Science and Technology, Dec. 1982, pp. 2828–2833.

Hwang J M et als: "Ultra–Trin Film SOI/CMOS With Selective–EPI Source/Drain for Low Series Resistance, High Drive Current" Symposium on VLSI Technology. Digest of Technical Papers, Honolulu, Jun. 7–9, 1994 No. Symp.14, Jun. 7 1994, Institute of Electrical and Electronics Engineers, p. 33/34 XP000498570.

*Primary Examiner*—Tom Thomas
*Assistant Examiner*—Bernard E. Souw
*Attorney, Agent, or Firm*—Oblon, Spivak, McClelland, Maier & Neustadt, P.C.

[57] ABSTRACT

A process for making a MOS transistor. The transistor includes a source, a channel and drain formed on a portion of silicon film in a silicon-on-insulator type structure. A field insulation layer surrounds the film. A grid structure with insulated flanks is formed above the channel. Source and drain contacts are formed on the portion of the silicon film between the field insulation layer and the grid structure. The source and drain contacts are self-aligned on the grid structure and the field insulation layer is placed directly adjacent to the grid structure.

20 Claims, 5 Drawing Sheets

METHOD FOR PRODUCING A TRANSISTOR WITH SELF-ALIGNED CONTACTS AND FIELD INSULATION

DESCRIPTION

1. Background of the Invention

This invention relates to a field effect transistor in which the field insulation and contact areas are self-aligned with its active region, and a process for making this transistor.

More precisely, the invention relates to the manufacture of this transistor on a Silicon On Insulator type substrate, subsequently referred to as SOI in the rest of the text.

Applications of the invention include microelectronics for the manufacture of Metal Oxide Semiconductor (MOS) type devices, and particularly for integrated circuits useable in an environment subject to radiation.

2. Discussion of the Background

Figure 1:
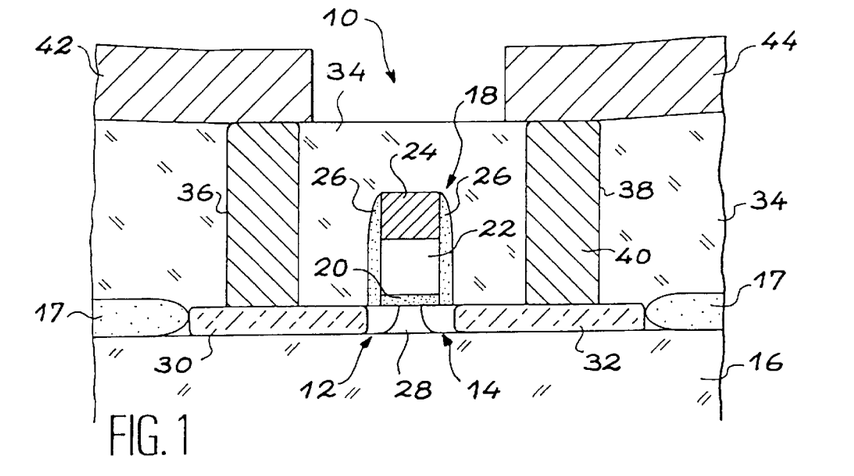
FIG. 1, already described, is a longitudinal diagrammatic section through a known type of MOS field effect transistor.

The state of the art closest to the invention is shown in FIG. 1 in the appendix. This figure diagramatically shows a cross-section through the structure of a MOS type transistor 10 made on an SOI substrate. The active region 12 of the transistor 10 is formed in a silicon thin film 14 covering a buried layer of silicon oxide $SiO_2$ 16.

The active region 12 is delimited by thick silicon oxide pads 17 of the LOCOS (LOCalized Oxidation of Silicon) type formed in the silicon thin film 14. The pads 17 mutually isolate the different transistors made on the same SOI substrate. A grid structure 18 comprises a stack, with a grid insulator layer 20, a grid 22, and a shunt layer 24 forming a contact area on grid 20 and lateral spacers 26 formed on the stack flanks, in order.

The grid structure 18 is placed above the transistor channel 28 and the source region 30 and drain region 32 are formed by doping the thin film 14 on each side of the grid structure.

A thick layer 34 of BPSG (borophosphosilicate glass) type glass covers the active region 12 and surrounds the grid structure 18.

Contact holes 36, 38 formed in the glass layer 34, vertically in line with the source 30 and drain 32, and metal 40 formed in holes 36, 38 form conductive tracks connecting the source and drain to metallic interconnection lines 42, 44 respectively formed on layer 34.

A large number of photolithography steps are necessary to define its components and to make a transistor according to FIG. 1.

A first step is necessary to form the field oxide pads 17. A second photolithography step is used to make the grid structure 18. Finally, a photolithography step is necessary to make the contact holes in the glass layer 34.

Formation of the grid structure 18 comprises deposition of the grid insulator layer 20, the grid layer 22 and the shunt layer 24, then etching these layers using a mask defining the shape and dimensions of the grid structure. The position of the mask defining the grid with respect to the mask used to define the oxide pads is difficult for devices with high integration. Thus, the process is incapable of making a very precise alignment of the grid on the active area, and carrier type inversion problems are observed on the flanks of the active area. These problems are due particularly to coupling between the grid and the flanks of the active area when the field insulation is partially removed in the field area.

Another difficulty in making the transistor in FIG. 1 is due to the alignment of contact holes on the source and drain regions. This difficulty also forms a limitation to miniaturization of devices.

SUMMARY OF THE INVENTION

Thus, one purpose of the invention is to propose a transistor and its manufacturing process on an SOI substrate which does not have any of the difficulties mentioned above.

Another purpose is particularly to propose a process in which firstly the grid is automatically aligned with the active region comprising the channel, and secondly the contact areas are automatically aligned with the grid. Another purpose of the invention is to propose a process with a minimum number of photolithography steps.

Another purpose of the invention is to propose a transistor enabling total control with low inversion. The low inversion condition is the condition in which the transistor is conducting under the conducting limit at high inversion conditions. It is considered that total control in low inversion is obtained when there is no current leak in these operating conditions.

Finally, another purpose of the invention is to propose a transistor capable of operating in a "hostile" environment subject to ionizing radiation.

In order to achieve the purposes mentioned above, the subject of the invention is more precisely a process for making a transistor on an SOI type support comprising a layer of insulating silicon oxide, called the buried oxide layer and a thin silicon film covering the buried oxide layer, the process comprising the following steps in sequence:

a) formation of a stack on the thin silicon film, comprising a grid insulator layer and a grid material layer, in order, b) formation of a first etching mask according to a pattern corresponding to an active area of the transistor, on the stack, c) etch the grid material layer, the grid insulator layer and the thin film, to form a column with first flanks defined according to the pattern of the first etching mask, d) formation of a layer of electrical insulating material around the column, and removing the surface of this layer stopping on the column, e) etch the grid material layer in the column according to a second mask to form a grid structure with the second flanks, f) electrical insulation of the flanks of the grid structure, g) formation of the source and drain regions in the thin film by implantation of impurities, h) self-aligned formation of contact areas on the grid structure in the source and drain regions.

The process according to the invention is particularly suitable for SOI type substrates for which the thin film is thinner than 20 nm. However, it can be implemented with other thicknesses.

Furthermore, the electrical insulation on the grid flanks and the formation of contact areas self-aligned on the grid avoids the constraint of carrying out a precise check of the position of the contact holes in the layer of electrical insulating material.

Note also that the process according to the invention only requires two photolithography steps to form the transistor.

According to one aspect of the invention, in step a) the process may also include the formation of a protection layer above the layer of grid material, the protection layer also being etched in step c), and forming a stop layer when removing the surface of the layer of insulating material in step d). The protection layer is eliminated after step d).

One function of the protection layer is to protect the upper part of the grid from any oxidation. Thus, after the protection layer has been eliminated, it is easier to form the contact area on the grid with a connection line or a layer of conducting material called the "shunt".

According to another aspect of the invention, after step d) and after exposing the grid material, the process may also include the formation of a "shunt" layer covering the layer of electrical insulating material and coming into contact with the grid material, the shunt layer also being etched during step e) according to the second etching mask, and the second flanks of the shunt layer formed during step e), also being electrically insulated during step f).

The shunt layer, preferably made of a metal polysilicide, forms a connection line for grid addressing.

According to one particular embodiment of the process, it may also include oxidation of the flanks of the column formed in step c), before step d), to cover them with a "flanks" oxide layer. This oxidation rounds the edges of the active region of the future transistor and facilitates checking its characteristic in low inversion.

The flanks oxide layer will also act as an etching stop layer in step e.

The formation of contact areas on the source and drain regions does not require an additional photolithography step. For example, contact areas are formed by conform deposition of a metal layer, self-aligned with the grid structure and by polishing this metal layer. The fact that there is no photolithography step for making the contact areas avoids difficult alignment problems and enables miniaturization of devices.

According to another aspect of the invention, the process may also include elimination of the grid oxide layer exposed on each side of the grid during step e) and self-aligned silicidation of the metal layer with the thin film exposed by elimination of the grid oxide layer. Due to this measure, good contact is guaranteed between the source and drain regions and the metal layer.

Another purpose of the invention is a field effect transistor comprising a source, a channel and a drain formed in a portion of silicon film in a silicon on insulator (SOI) type structure, a field insulation layer around the sides of the portion of silicon film, a grid structure with insulated flanks formed above the channel, and source and drain contacts formed on the portion of silicon film between the field insulation layer and the grid structure. According to the invention, the source and drain contacts are self-aligned on the grid structure and on the field insulation layer and are directly placed adjacent to the flanks of the grid structure. Furthermore, the contacts are delimited by a layer, called the flanks oxide layer, approximately perpendicular to the portion of the silicon film and self-aligned on the field insulation layer.

Other characteristics and advantages of the invention will become clear from reading the following description, given for illustrative purposes only and in no way restrictive, with reference to the figures in the attached drawings.

DETAILED DESCRIPTION OF THE PREFERRED EMBODIMENTS

Figure 2:
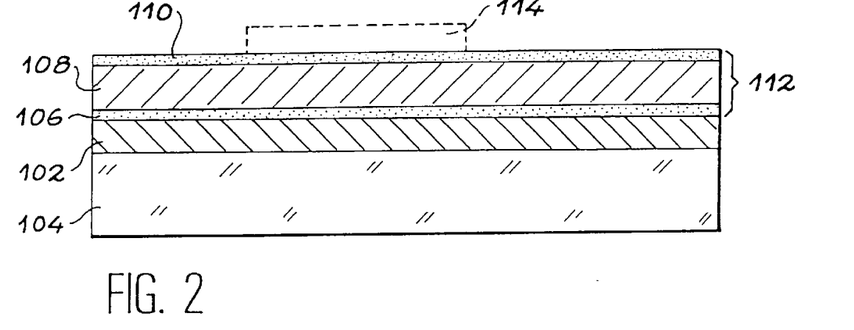
FIG. 2 is a diagrammatic section through a stack of layers on an SOI type substrate, from which a transistor can be made conform with the process according to the invention.

FIG. 2 shows the initial structure for manufacture of a transistor.

The transistor is made on an SOI substrate 100 comprising a thin silicon surface film 102 fixed to a layer of insulating silicon oxide, called the buried layer 104.

The thin film 102 is preferably 50 nm thick or less.

A first oxide layer 106 is formed by oxidation of the silicon on the free surface of the thin layer 102.

The layer 106 forms the insulating layer of the transistor grid that is made.

A layer 108 called the grid material layer made for example of polycrystalline or amorphous silicon, is deposited on the grid insulator layer 106.

Finally a protection layer 110, for example made of silicon nitride or an oxide is deposited on layer 108 of grid material in order to recover its free surface. This protection layer will subsequently be used as a polishing stop layer. The stack formed by layers 106, 108 and 110 is denoted by the general reference 112.

A first etching mask 114, shown as a discontinuous line in FIG. 2, is formed on the stack 112, according to photolithography processes known in themselves.

Mask 114 defines the dimensions of the active area of the transistor that is made.

The remaining of the description is specifically related to the production of a single field effect transistor. However, several such transistors can be made simultaneously on the same substrate, for example forming an integrated circuit. In this case, a mask is formed on stack 112 with several patterns similar to pattern 114 and defining active regions for all the transistors.

After formation of the mask, layers 110, 108, 106 of the stack, and film 102 of substrate 100, are etched. The buried oxide layer 104 is used as a stop layer during this etching.

Figure 3:
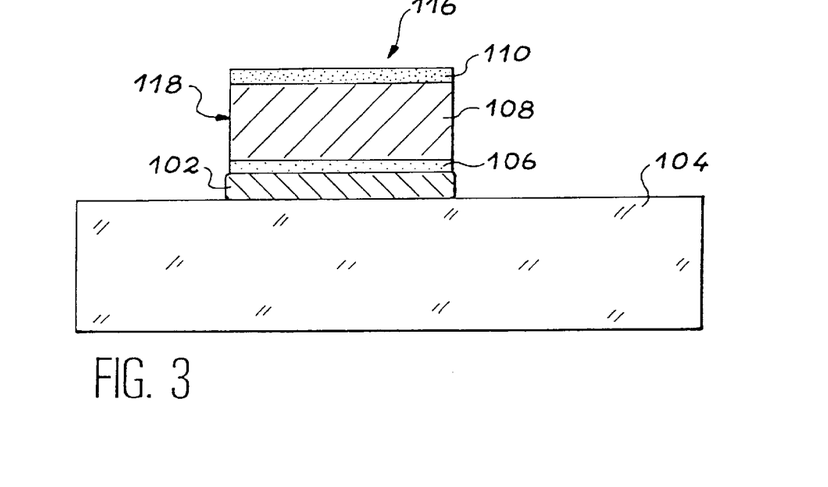
FIG. 3 is a diagrammatic section showing the formation of a column by etching the stack in FIG. 2, FIGS. 4 and 5 are diagrammatic sections of the stack illustrating the column being coated with a layer of insulating material and removing the surface of the layer of insulating material.

After etching and eliminating the mask 114, a column 116 that can be seen in FIG. 3 is obtained. The column comprises portions of thin film 102, the grid oxide layer 106, the grid layer 108 and the protection layer 110, in sequence. The portion of thin film 102 on column 116 corresponds approximately to the active part of the transistor.

The flanks of column 116 are marked with reference 118.

After elimination of mask 114, the flanks 118 are oxidized. This oxidation particularly relates to the thin silicon film 102 and the grid material 108 of the column 116. During this step, the protection layer 110 limits (when an oxide is used) or prevents (when silicon nitride is used) oxidation of the upper surface of the grid material that it covers.

Figure 4:
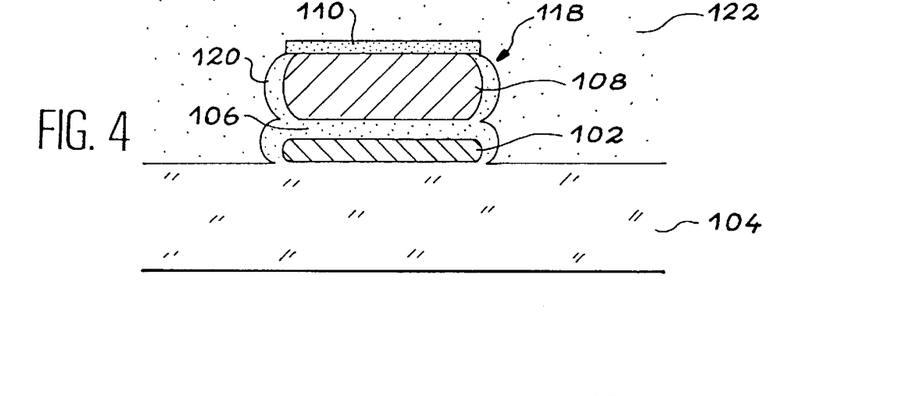

FIG. 4 shows a section through the structure obtained. This figure shows characteristic shapes of column 116 with the oxidized flanks.

A first characteristic shape is a bird's beak shape at the height of the grid oxide layer 106. Another characteristic shape is rounding of the lower edges of the portion of thin silicon film remaining from column 116.

These characteristic shapes are preferably obtained with high temperature and/or high pressure oxidation. High temperature and/or high pressure oxidation refers to oxidation that takes place at a temperature exceeding 1000° C. and a pressure exceeding $10^5$ Pa. High pressure oxidation is described in the document "High Pressure Oxidation of Silicon in Dry Oxygen" by Liang N. Lie et al. in Solid-State Science and Technology, December 1982, pages 2828–2833.

Due the rounded shape of the portion of the thin film, in other words the future active region of the transistor, transistor leakage currents under low inversion conditions can be limited. Control of leakage currents under low inversion conditions, in other words below the conduction threshold, can reduce the consumption of the transistor when not conducting.

The flanks oxide layer that covers the flanks 118 of column 116 is denoted by reference 120. Its thickness may for example be between 5 and 20 nm. A subsequent step in the process consists of forming a layer 122 of electrical insulating material around column 116 to coat it. The layer 120 is shown in FIG. 4. For example the electrical insulating material may be a layer of oxide (glass) doped with PSG or BPSG type phosphorus.

After depositing layer 122 of insulating material, a heat treatment is applied for its stabilization and plastic flow.

The function of the layer of insulating material (PSG or BPSG glass) is to mutually isolate the various transistors or components made on the same substrate. Another function is to harden the transistors to resist ionizing radiation.

Selective mechanochemical polishing ineffective on silicon nitride removes the surface of layer 122 of insulating material down to the silicon nitride protection layer 110, that covers the grid material layer 108.

Figure 5:
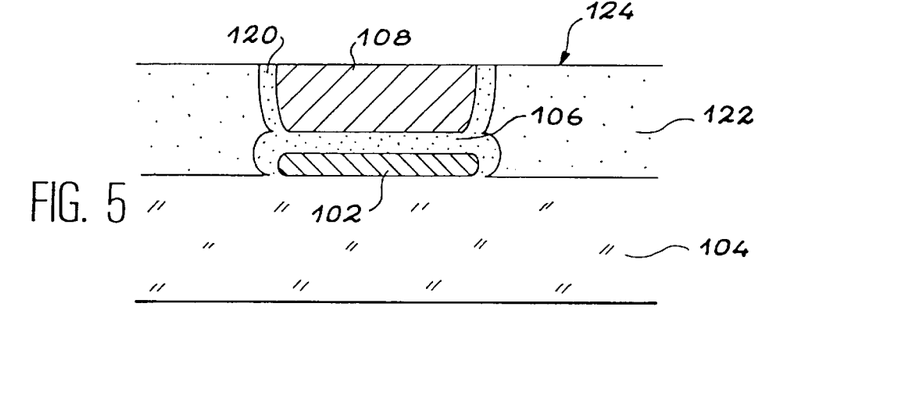

Then, after the protection layer has been eliminated, the structure shown in section in FIG. 5 is obtained. The layer of grid material 108 is exposed and is approximately flush with the plane of the polished surface 124 of layer 122.

At this stage of the process, doping can be done by implantation of silicon in the grid layer. Impurities leading to a n or p type conductivity are implanted.

Figure 6:
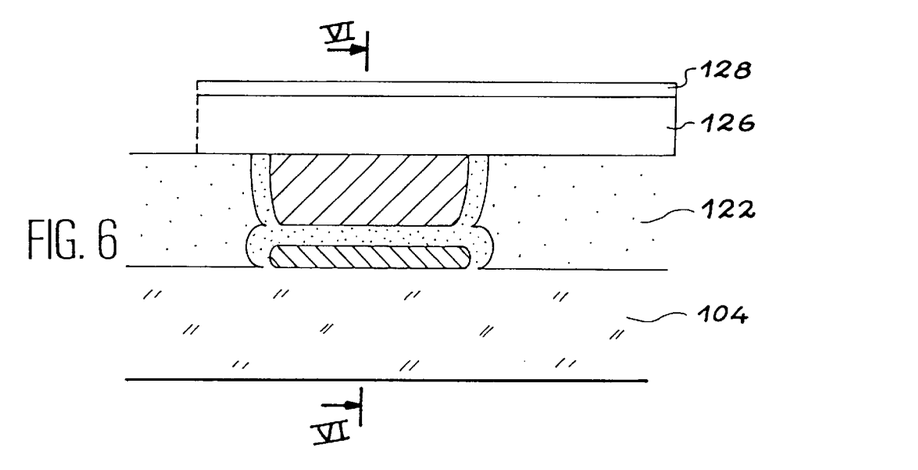
FIG. 6 is a diagrammatic section through the stack illustrating the formation of a shunt layer on the structure in FIG. 5, FIGS. 7 and 8 are sections along plane VI—VI shown in FIG. 6, making an angle of 90° with the plane of the section in FIGS. 1 to 6, and illustrating the manufacture of a grid structure.

The process continues, as shown in FIG. 6, by formation of a "shunt" layer 126 above the grid material layer. The shunt layer deposited as an uninterrupted plate also covers the polished surface of the insulating layer 122. The shunt layer 126 is preferably made of a refractory metal polysilicide. It is covered by an undoped deposited oxide layer 128. The shunt layer can improve the contact area on the grid and thus increase the transistor operating rate. This layer, when it has been shaped, can also form an access line for polarization of the grid, for example such as a line of words.

A second etching mask 130 formed on the deposited oxide layer 128 defines the location and dimensions of a grid structure 132 above the active region of the transistor. Successive etching of the oxide layer 128, the shunt layer 126 and the material layer 108, stopping on the grid oxide layer 102 and on the flanks oxide layer 120, results in the structure shown in FIG. 7.

Figure 7:
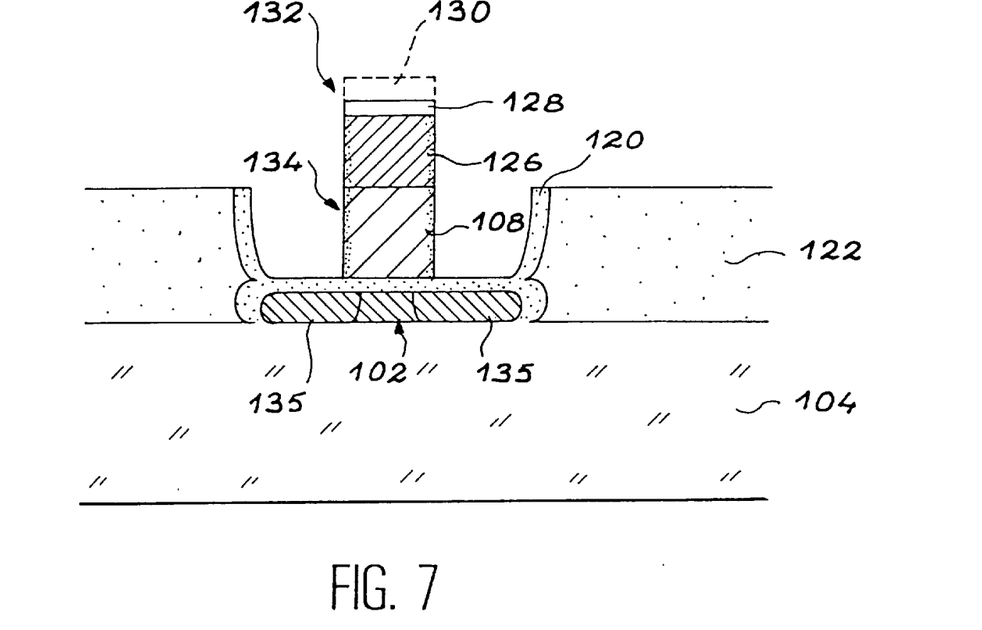

Note that the FIG. 7 and subsequent figures show a section along plane VI—VI shown in FIG. 6, which is at an angle of 90° with the section planes shown in the previous figures.

The lateral extension of the etchings according to the second mask 130 is limited in the area above the portion of the thin film 102 by the flanks oxide 120. Etchings according to mask 130 thus clear the grid structure 132 which is therefore necessarily in line with the remaining portion of thin film 102, in other words in line with the future active region of the transistor. The grid structure comprises the layer of grid material 108, the shunt layer 126 and the deposited oxide layer 128, after shaping.

Advantageously, after elimination of mask 130, the process is continued by oxidation of flanks 134 of the grid structure, in other words in particular the layers of grid material 108 and the shunt layer 126. It is also possible to make a thin oxide deposit directly on the flanks.

To form source and drain regions of the transistor, a first ion implantation is done in the thin film 102 using the grid structure 132 as an implantation mask. Doped regions formed during the first implantation are shown in FIG. 7 and identified by reference 135.

After the formation of lateral spacers 136 on the flanks of the grid structure and on the flanks oxide layer 120 covering the insulating layer 122, a second implantation is made at a higher dose. The implantation is made with impurities that result in an n+ or p+ conductivity depending on the type of transistor channel made.

Figure 8:
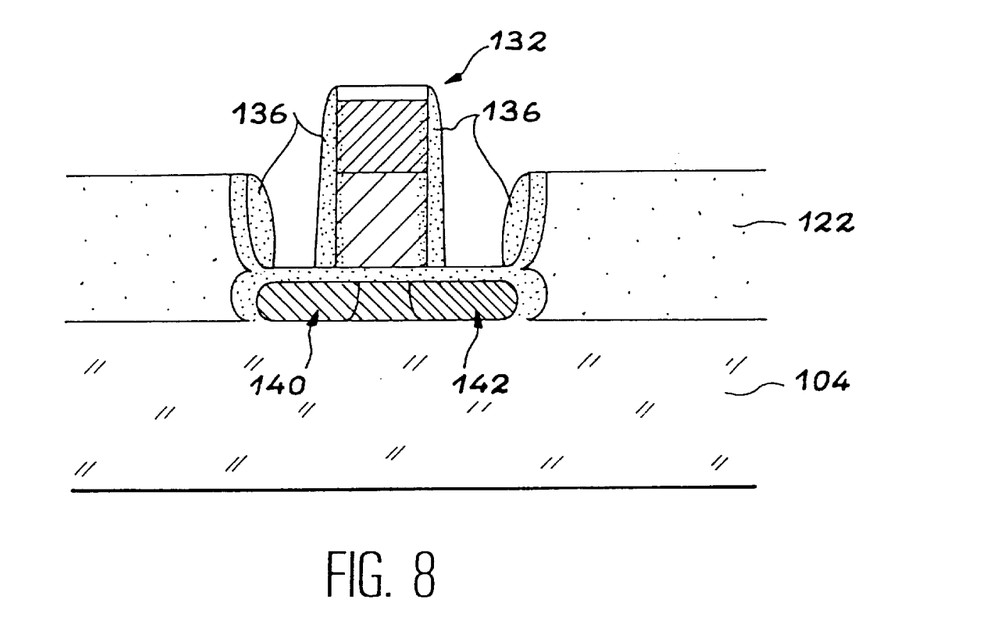

After implantation, annealing is done and the structure in FIG. 8 is achieved. In this figure source and drain regions are marked with references 140 and 142 respectively.

Lateral spacers 136 are obtained by depositing a layer that isolates the grid from contact areas 150 and 152, then by etching this layer by anisotropic etching, selectively with respect to the oxide on the flanks. Advantageously, this layer is made of silicon nitride. It may be made of an oxide but its selectivity while etching spacers will not be as good. Lateral spacers 136 have the function of forming gradual source and drain regions and also of protecting, these regions close to the grid and on the edge of the contact areas made later.

In particular, spacers 136 avoid or limit lateral etching of layer 122 of insulating material (PSG) during the cleaning operations that precede the formation of contact areas on drain and source regions.

The formation of contact areas on the source and drain regions is preceded by eliminating the residual grid oxide layer around the grid structure, so that part of the thin film 102 corresponding to the source and drain can be exposed.

During this operation, the oxidized flanks of the grid structure and the flanks oxide 120 covering the sides of the insulating material layer 122, are protected by lateral spacers 136.

Figure 9:
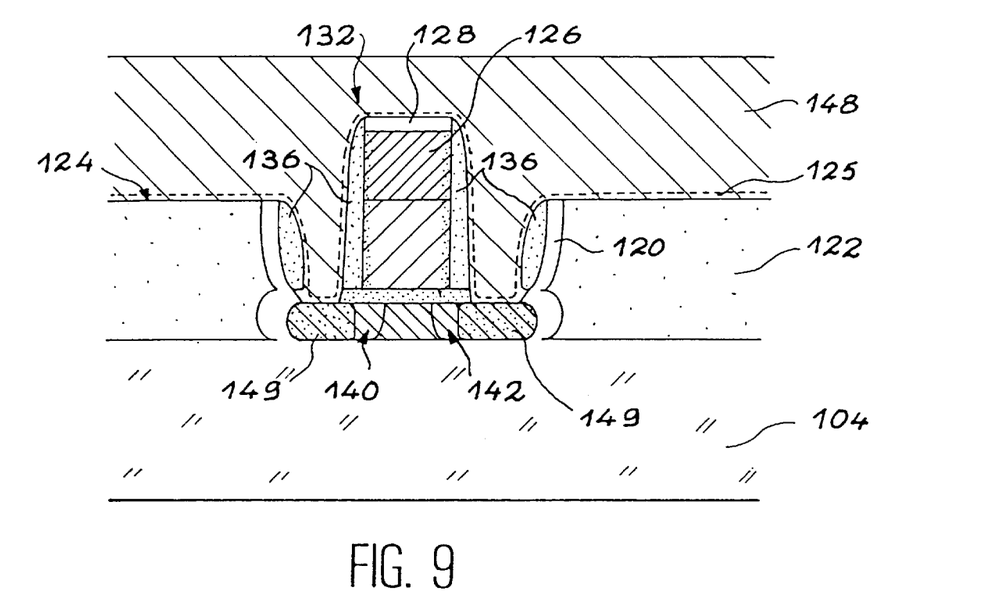
FIGS. 9, 10 and 11 are sections through the stack along the cut plane in FIGS. 7 and 8 and illustrate the formation of contact areas on the transistor source and drain regions.

A metal layer 148, for example tungsten, is then formed by chemical vapor phase deposition on the entire structure. As shown in FIG. 9, the metal layer 148 comes into contact with the exposed source and drain regions 140, 142 and surrounds the grid structure 132. The chemical vapor deposition technique (CVD) can produce a conform deposit.

Furthermore, before depositing the metal layer 148, the free surface 124 of the insulating material layer 122 may be covered with a titanium/tungsten layer 125, and advantageously a two layer system with a composition capable of performing diffusion barrier and contact barrier functions. For example, it could be a Ti-W layer in a composition close to stoechiometry. This layer, shown in FIG. 9, forms a metal bond layer and also acts as a metal diffusion barrier in the insulation.

Advantageously, the source 140 and drain 142 are silicided before layer 125 is deposited by selective silicidation on the exposed silicon. Silicidation can reduce the resistance at the metal-semiconductor interface and thus improve contact areas on the source and drain. In FIG. 9, silicided parts are shown as reference 149.

Figure 10:
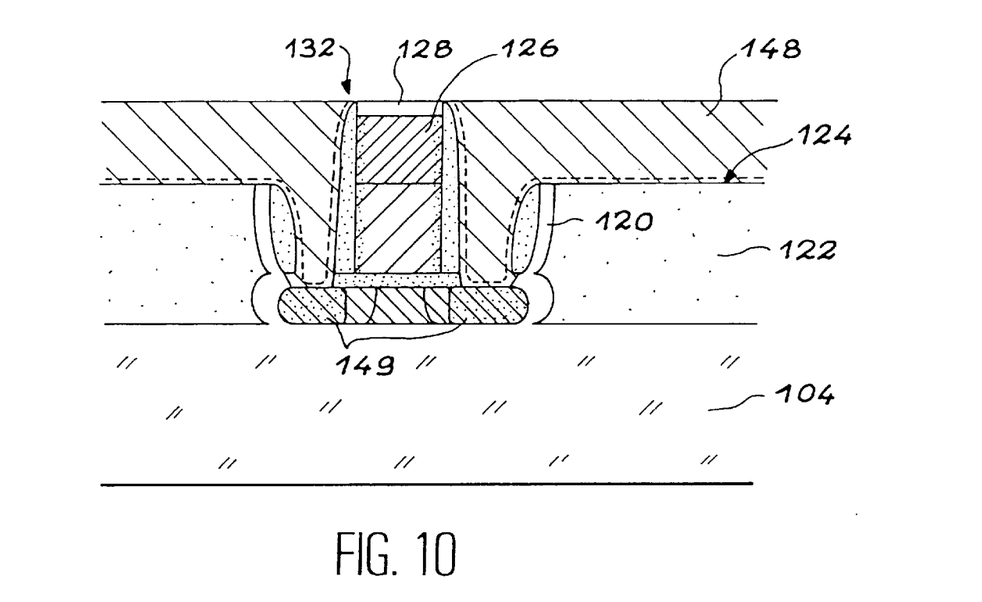

As shown in FIG. 10, the next step is to polish the metal layer to remove its surface down to the silicon oxide layer 128 of the grid structure 132. Layer 125 is subsequently polished.

Figure 11:
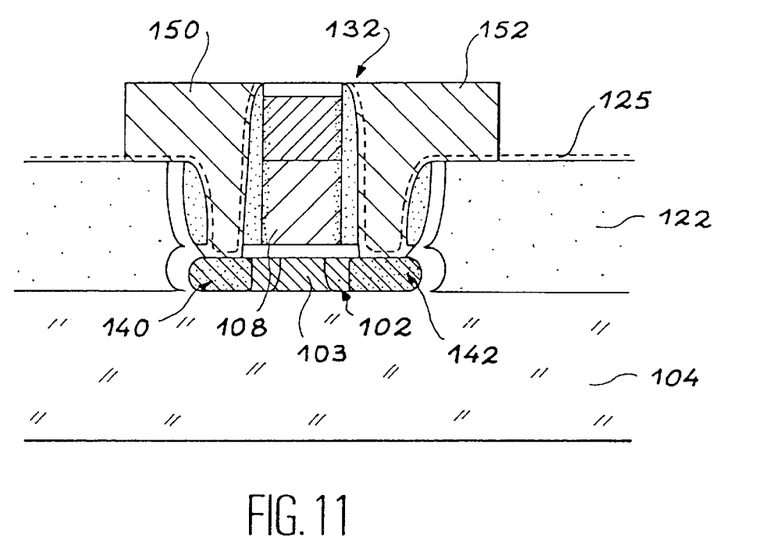

Finally, as shown in FIG. 11, the metal layer and the bond layer may be etched to shape the contacts 150, 152. Other conventional metal or insulation deposition operations can be carried out to form connections between the transistor and an integrated circuit. These operations, known in themselves, will not be described in detail here.

FIG. 11 also shows the characteristics of the transistor according to the invention.

The main characteristics of the transistor are an active region formed in layer 102, with rounded edges, a grid 108, 132 self-aligned on the channel in the active region, an active region protected by an insulating layer 122 and contacts 150, 152 self-aligned both on the grid and on the insulation layer.

Note that the flanks oxide layer 120 that extends approximately perpendicular to the active region avoids any risk of the contact metal overlapping over the edges of the active area, in other words on the flanks of the portion of thin film forming the active area.

The insulating materials forming the flanks oxide layer 120 and the insulating layer 122 are not the same. The flanks oxide layer is formed by oxidation whereas the insulation layer 122 is formed by deposition.

Furthermore, the presence of the flanks oxide layer 120 means that an offset can be formed between the active area and the insulation layer 122.

Figure 12:
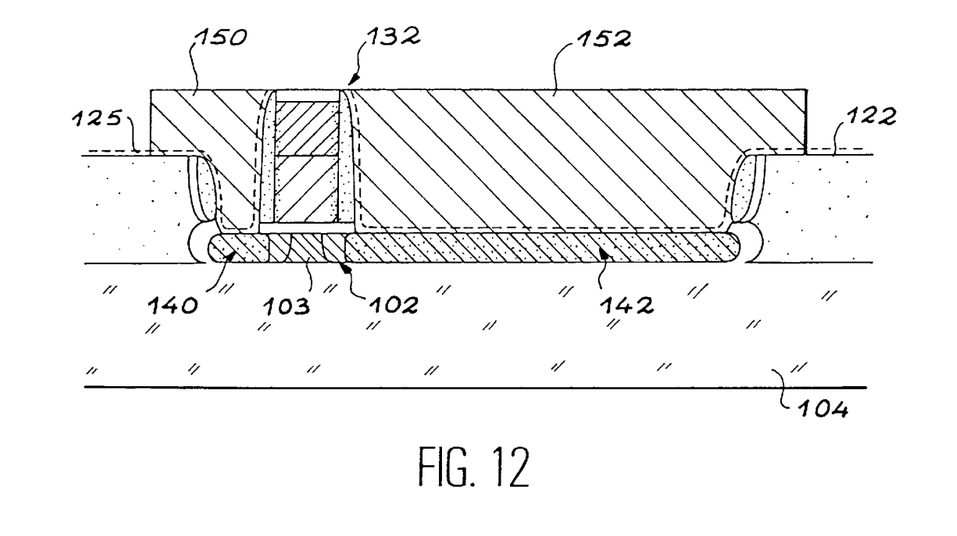
FIG. 12 is a sectional view of a particular embodiment of a transistor according to the invention.

FIG. 11 shows the manufacture of a transistor with a symmetric structure, and FIG. 12 shows a transistor conform with the invention for which the grid structure 132 is offset from the flanks of the insulation layer 122.

However, the grid is always perfectly aligned with the channel of the active region. In FIGS. 11 and 12, the channel is shown as reference 103.

This figure shows that the contact areas 150, 152 formed on the source 140 and drain 142 are self-aligned on the grid and the active area and are laid out directly in contact with the grid structure, in contact with the lateral spacers. The contact areas 150, 152 form a kind of superelevated and metallized source and drain.

Finally, the process and transistor according to the invention can increase the integration density, and, as mentioned above, save an expensive masking step critical for making contacts on source and drain.

What is claimed is:

1. A process for making a transistor on an SOI type support comprising a silicon oxide layer and a thin silicon film covering the silicon oxide layer, the process comprising the following steps:

a) forming a stack comprising a grid insulator layer and a grid material layer in this order on the thin silicon film, b) forming a first etching mask on the stack according to a pattern corresponding to an active region of the transistor, c) etching the grid material layer, the grid insulation layer and the thin silicon film to form a column with first flanks defined according to the pattern of the first etching mask, d) forming a first insulating layer of electrical insulating material around the column, and planarizing a surface of this layer until the grid material layer of the column is exposed, e) etching the grid material layer in the column according to a second mask to form a grid structure with second flanks, f) forming a second insulating layer of electrical insulating material on the grid structure so as to electrically insulate the second flanks of the grid structure, g) forming source and drain regions in the thin silicon film by implantation of impurities, and h) forming contact areas on the grid structure in the source and drain regions.

2. The process according to claim 1, further comprising:

forming a protection layer on the grid material layer during step a), etching the protection layer during step c), and forming a stop layer by planarizing the surface of the first insulating layer in step d), and eliminating the protection layer after step d).

3. The process according to claim 1, wherein the first etching mask is eliminated before step d).

4. The process according to claim 1, further comprising:

before step d), oxidizing the first flanks of the column formed in step d) to cover the first flanks with flank oxide layers.

5. The process according to claim 4, wherein the etching in step e) is done with a stop on the grid oxide layer and the flank oxide layers.

6. The process according to claim 4, wherein the flanks are oxidized with at least one of a high temperature and a high pressure.

7. The process according to claim 1, further comprising:

after step d) and after exposing the grid material layer, forming a shunt layer covering the first insulating layer and contacting the grid material layer, wherein the shunt layer is also etched during step e) according to the second etching mask, and the second flanks of the grid structure including the shunt layer formed during step e) are also electrically insulated during step f).

8. The process according to claim 1, wherein the step of forming contact areas in step h) comprises a self-aligned deposition of a metal layer and polishing of this metal layer.

9. The process according to claim 8, further comprising:

eliminating the grid oxide layer exposed on each side of the grid structure during step e) and self-aligned silicidation of the metal layer with the thin silicon film exposed by eliminating the grid oxide layer.

10. The process according to claim 8, wherein the metal layer is deposited using a chemical vapor phase deposition (CVD) technique.

11. The process according to claim 8, further comprising:

forming at least one of an adhesion and a diffusion barrier layer on the first insulating layer before deposition of the metal layer.

12. The process according to claim 1, wherein the step of forming the source and drain regions comprises:

a first implantation of doping impurities at a low dose, forming lateral spacers on at least one of 1) the second flanks of the grid structure, 2) on the shunt layer, and 3) on the first flanks including the first insulating layer, a second implantation of doping impurities at a dose higher than the dose of the first implantation.

13. The process according to claim 12, wherein the step of forcing lateral spacers includes the deposition of a layer of silicon nitride and then anisotropic etching of this layer.

14. The process according to claim 1, wherein the first insulating layer formed during step d) includes a material chosen from PSG and BPSG.

15. The process according to claim 1, further comprising:

forming interconnection lines connected to the transistor source and drain through contact areas.

16. The process according to claim 2, wherein the protection layer includes silicon nitride.

17. The process according to claim 2, wherein the grid layer is doped before the protection layer is eliminated.

18. The process according to claim 1, wherein the grid layer includes material chosen from polycrystalline silicon and amorphous silicon.

19. The process according to claim 2, wherein the first etching mask is eliminated before step d).

20. The process according to claim 2, further comprising:

before step d), oxidizing the first flanks of the column formed in step d) to cover the first flanks with flank oxide layers.

* * * * *